(12) United States Patent
Lee et al.

(10) Patent No.: US 7,145,152 B2
(45) Date of Patent: Dec. 5, 2006

(54) STORAGE CAPACITOR DESIGN FOR A SOLID STATE IMAGER

(75) Inventors: Ji-Ung Lee, Niskayuna, NY (US); Douglas Albagli, Clifton Park, NY (US); George Edward Possin, Niskayuna, NY (US); William Andrew Hennessy, Schenectady, NY (US); Ching-Yeu Wei, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 294 days.

(21) Appl. No.: 10/687,407

(22) Filed: Oct. 14, 2003

(65) Prior Publication Data

US 2005/0078231 A1    Apr. 14, 2005

(51) Int. Cl.
*G02F 1/136*   (2006.01)
*H01L 31/115*  (2006.01)
*G06T 11/00*   (2006.01)

(52) U.S. Cl. ................................. 250/370.14

(58) Field of Classification Search ........... 250/370.14, 250/370.08, 370.09, 370.11, 370.13; 257/291
See application file for complete search history.

(56) References Cited

U.S. PATENT DOCUMENTS

| 5,198,673 | A | * | 3/1993 | Rougeot et al. ....... 250/370.11 |
| 5,610,403 | A | | 3/1997 | Kingsley et al. |
| 5,648,654 | A | | 7/1997 | Possin |
| 5,744,807 | A | * | 4/1998 | Weisfield ............... 250/370.09 |
| 5,770,871 | A | * | 6/1998 | Weisfield .................... 257/232 |
| 6,060,714 | A | | 5/2000 | Zhong et al. |
| 6,559,506 | B1 | * | 5/2003 | Lee et al. ................... 257/350 |
| 6,664,527 | B1 | * | 12/2003 | Kobayashi et al. ...... 250/208.1 |
| 6,740,884 | B1 | * | 5/2004 | Lee et al. ............. 250/370.08 |
| 2002/0145116 | A1 | | 10/2002 | Choo et al. |
| 2003/0189175 | A1 | | 10/2003 | Lee et al. |
| 2003/0234759 | A1 | * | 12/2003 | Bergquist .................... 345/92 |

FOREIGN PATENT DOCUMENTS

FR    2838240    10/2003

OTHER PUBLICATIONS

French Search Report, May 22, 2006.

* cited by examiner

*Primary Examiner*—Otilia Gabor
(74) *Attorney, Agent, or Firm*—Jean K. Testa; Donald S. Ingraham

(57) ABSTRACT

Storage capacitor design for a solid state imager. The imager includes several pixels disposed on a substrate in an imaging array pattern. Each pixel includes a photosensor coupled to a thin film switching transistor. Several scan lines are disposed at a first level with respect to the substrate along a first axis and several data lines are disposed at a second level along a second axis of the imaging array. Several data lines disposed at a second level with respect to the substrate along a second axis of the imaging array pattern. Each pixel comprises a storage capacitor coupled parallel to the photosensor, the storage capacitor comprising a storage capacitor electrode and a capacitor common electrode.

15 Claims, 3 Drawing Sheets

STORAGE CAPACITOR DESIGN FOR A SOLID STATE IMAGER

BACKGROUND OF THE INVENTION

The invention relates generally to solid state imagers, and more specifically to a storage capacitor design for solid state imagers.

Solid state radiation imagers typically comprise a large flat panel imaging device comprising a plurality of pixels arranged in rows and columns. Each pixel typically has a photosensor such as a photodiode coupled via a switching transistor (e.g., a thin film field effect transistor) to two separate address lines, a scan line and a data line. In each row of pixels, each respective switching transistor is coupled to a common scan line through that transistor's gate electrode. In each column of pixels, the readout electrode of the transistor (e.g., the source electrode of the transistor) is coupled to a data line. During nominal operation, radiation (such as an x-ray flux) is pulsed on and the x-rays passing through the subject being examined are incident on the imaging array. The radiation is incident on a scintillator material and the pixel photosensors measure (by way of change in the charge across the diode) the amount of light generated by x-ray interaction with the scintillator. Alternatively, the x-rays can directly generate electron-hole pairs in the photosensor (commonly called "direct detection"). The photosensor charge data are read out by sequentially enabling rows of pixels (by applying a signal to the scan line causing the switching transistors coupled to that scan line to become conductive), and reading the signal from the respective pixels thus enabled via respective data lines (the photodiode charge signal being coupled to the data line through the conductive switching transistor and associated readout electrode coupled to a data line). In this way a given pixel can be addressed through a combination of enabling a scan line coupled to the pixel and reading out at the data line coupled to the pixel.

One problem with such solid state radiation imagers is the limited dynamic range. Typically, the dynamic range can be increased by increasing the diode bias and the diode capacitance. Increasing the diode bias generally results in increased diode leakage and FET leakage when the diode is near or above saturation and may require large transistor gate control voltages to reduce the leakage. Another typical solution to increase the dynamic range is to increase the diode capacitance. Increasing the diode capacitance may require a thinner diode i-layer since the diode capacitance is inversely proportional to the diode thickness. Reducing the thickness of the diode i-layer results in higher leakage currents, which is undesirable.

It would therefore be desirable to provide increased dynamic range for the detector without increasing the diode leakage, FET leakage and pixel shorts.

BREIF DESCRIPTION OF THE INVENTION

In one embodiment, the present invention provides a storage capacitor for increasing the dynamic range of an imager. The imager comprises a plurality of pixels disposed on a substrate in an imaging array pattern comprising rows and columns, each of the pixels comprising a respective photosensor coupled to a respective thin film switching transistor. The imager further comprises a plurality of scan lines disposed at a first level with respect to the substrate along a first axis of the imaging array pattern, each row of pixels in the imaging array pattern having a respective scan line, each of the respective scan lines being coupled to a respective gate electrode in the thin film switching transistor for each pixel disposed along the respective row of pixels in the imaging array pattern. A plurality of data lines disposed at a second level with respect to the substrate along a second axis of the imaging array pattern, each column of pixels in the imaging array pattern having a corresponding data line, each of the respective data lines being coupled to a respective source electrode in the thin film switching transistors for each pixel disposed along the respective column of pixels in the imaging array pattern. Each pixel further comprises a storage capacitor coupled parallel to the photosensor, the storage capacitor comprising a signal electrode and a capacitor common electrode and a dielectric disposed between the capacitor signal electrode and the capacitor common electrode.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1A:
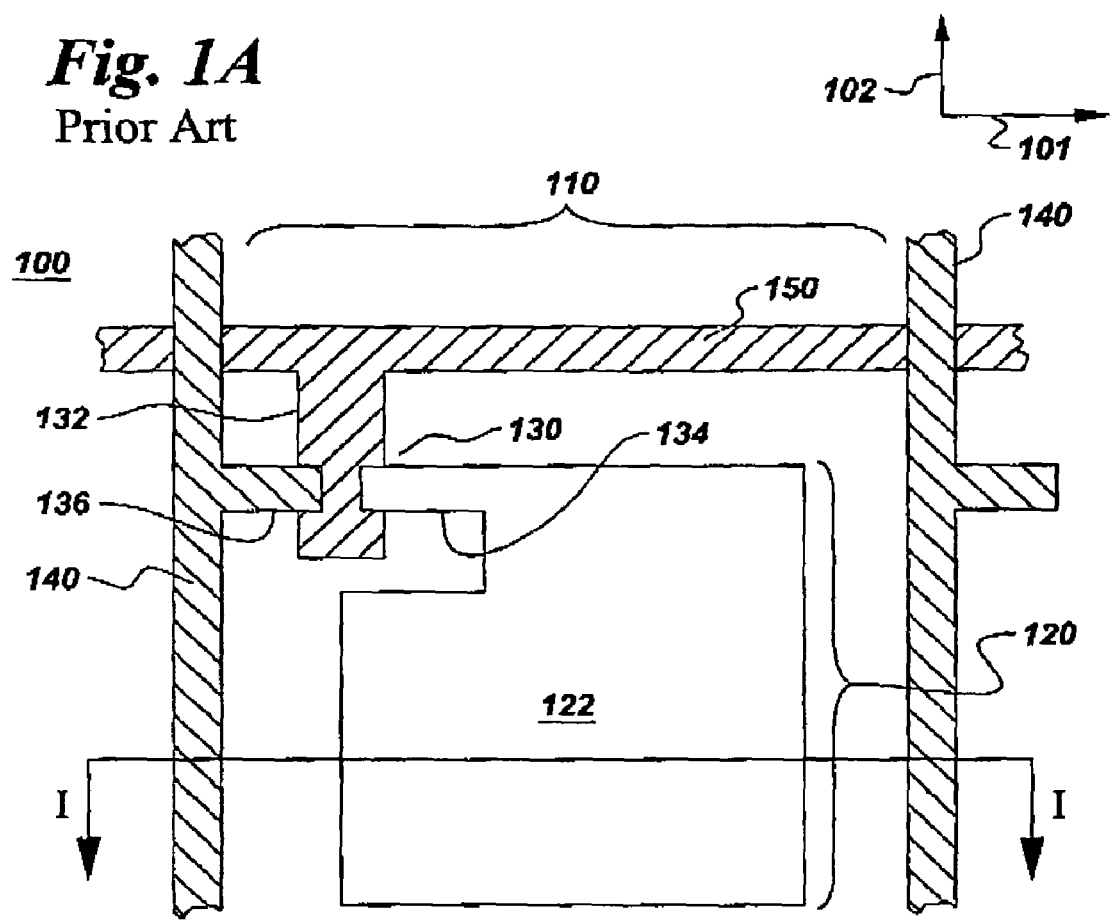
FIG. 1A is a plan view of a portion of an imager in accordance with the prior art.

A solid state radiation imager 100 comprises a plurality of pixels 110 (a representative one of which is illustrated in FIG. 1A) that are arranged in a matrix-like imaging array pattern comprising rows and columns of pixels 110. In one embodiment, the imager is an X-ray imager, however, the principles of this invention are suitable for use in other types of radiation imagers.

For purposes of illustration and not limitation, imager 100 has a first axis 101 that is the axis along which the rows of pixels are aligned, and a second axis 102 that is the axis along which the columns of pixels are aligned. Each pixel 110 comprises a photosensor 120 and a thin film switching transistor 130. Photosensor 120 typically comprises a photodiode composed in part of a lower pixel electrode 122 that substantially corresponds with the active (that is, photosensitive) area of the device. Switching transistor 130 typically comprises a thin film field effect transistor (FET) having a gate electrode 132, a drain electrode 134 and a source electrode (or readout electrode) 136. Imager 100 further comprises a plurality of data lines 140 and scan lines 150 (collectively referred to as address lines). At least one scan line 150 is disposed along first axis 101 for each row of pixels in the imaging array pattern. Each scan line is coupled to the respective gate electrodes 132 of pixels in that row of pixels. At least one data line 140 is disposed along second axis 102 for each column of pixels in the imaging array pattern, and is coupled to the respective readout electrodes 136 of pixels in that column of pixels.

Figure 1B:
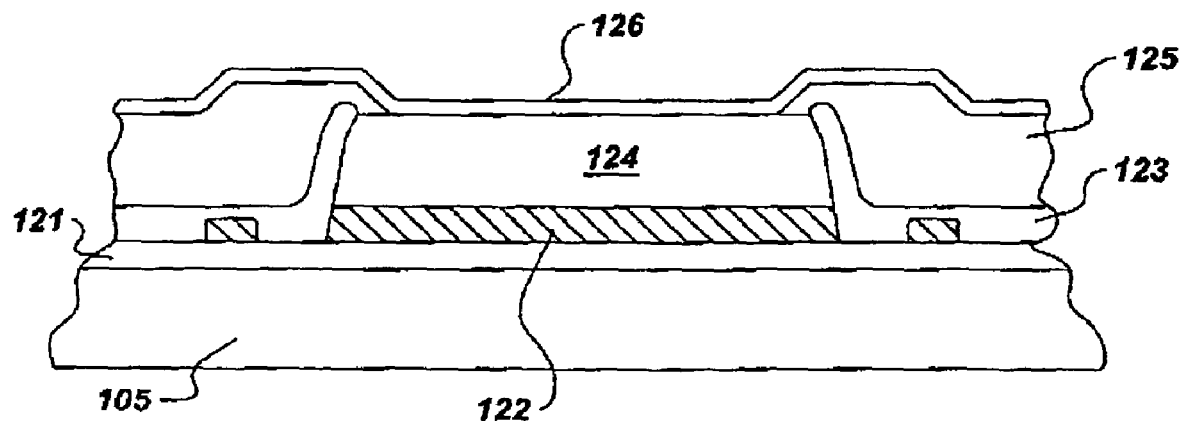
FIG. 1B is a partial cross-sectional view of a representative pixel taken along line I—I of FIG. 1A.

A partial cross-sectional view of one pixel 110 shown in FIG. 1A is presented in FIG. 1B. Photodiode 120 comprises a first dielectric material layer 121, pixel electrode 122, and a photosensitive material body 124. Photodiode 120 is disposed over a substrate 105. The first dielectric material layer 121 is typically disposed between pixel electrode 122 and substrate 105. The photosensitive material body 124 (typically comprising amorphous silicon) that is electrically coupled to a diode common electrode 126 that is disposed over the imaging array. Diode common electrode 126 comprises an optically transmissive and electrically conductive material, such as indium tin oxide or the like or alternatively can be a narrow strip of opaque metal. A second dielectric material layer 123, typically comprising silicon nitride or the like, extends over a portion of the sidewalls of the photosensitive material body 124, and a third dielectric layer 125, comprising polyimide or the like, is disposed between diode common electrode 126 and other components in the imaging array (except for the contact point to photosensitive material body 124 through a via in second dielectric material layer 123 and third dielectric layer 125).

Figure 2:
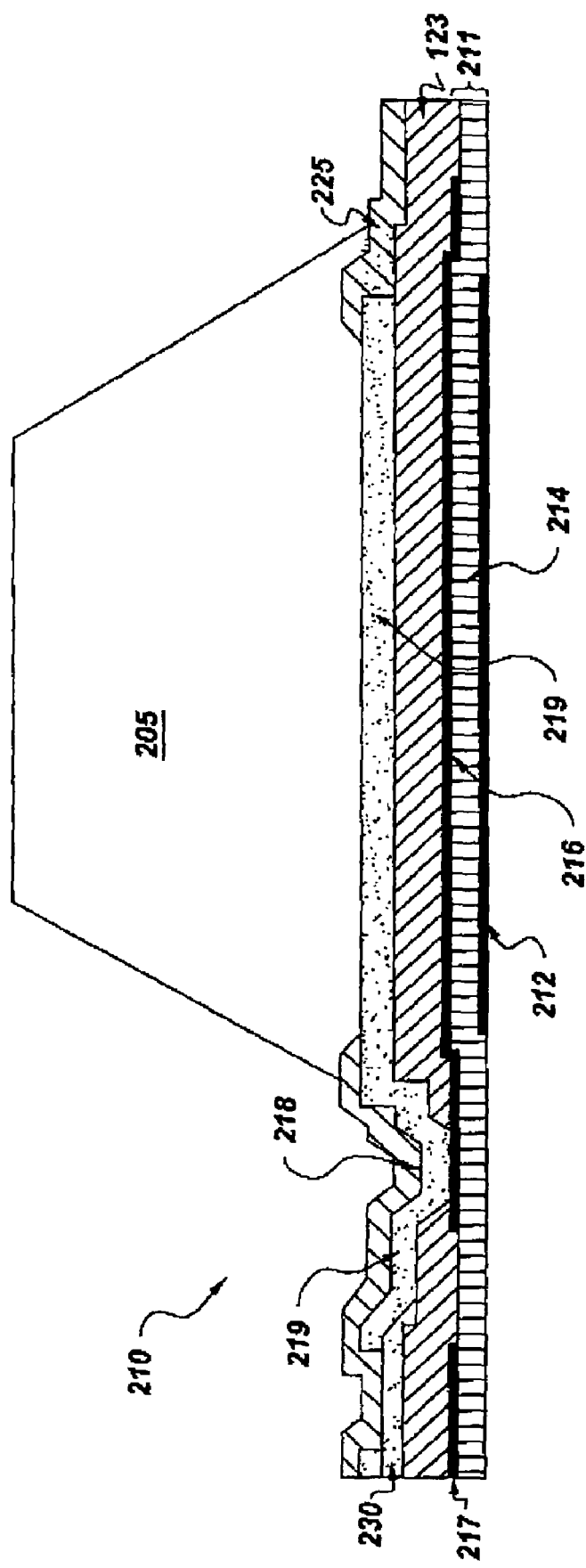
FIG. 2 is a partial cross-sectional view of a pixel implemented in accordance to an aspect of the invention.

FIG. 2 is a partial cross-sectional view of one pixel 210 of an imager (not shown) in accordance with one embodiment of this invention. The imager is similar to the imager 100 shown in FIGS. 1A–1B, except that the imager in FIG. 2 comprises pixels having a storage capacitor 211 coupled in parallel to photosensor 205. The storage capacitor increases the dynamic range of the imager. The imager comprises a plurality of pixels 210 disposed on a substrate in an imaging array pattern comprising rows and columns. In one embodiment, the substrate is glass. Each pixel comprises a respective photosensor 205 coupled to a respective thin film switching transistor 230. Dielectric layer 225 is disposed between the photosensor and the other components of the pixel. The thin film transistor is coupled to the data line 140.

As mentioned above, pixel 210 comprises a storage capacitor 211 coupled in parallel to the photosensor 205. The storage capacitor comprises a capacitor signal electrode 216, a capacitor common electrode 212 and a capacitor dielectric 214 disposed between the signal electrode and the capacitor common electrode as shown in FIG. 2. In one embodiment, capacitor signal electrode 216 is comprised of and co-fabricated using the same material as the gate electrode 217 of thin film transistor (TFT) 230. In a further embodiment, the capacitor signal electrode comprises at least two conductive layers. The conductive layers are shorted using source metal via 218.

In a further embodiment, conductive layer 219 is used to form both the lower pixel electrode of the photosensor and the source electrode of the TFT 230. In the illustrated embodiment, the capacitor signal electrode 216 and the conductive layer 219 are coupled together by a source metal via 218. In other words, the capacitor signal electrode is coupled to the source electrode of the thin film switching transistor and the lower pixel electrode of the photosensor using the source metal via. In the illustrated embodiment, the source to gate metal via is not under the photo diode 120 or over the storage capacitor common electrode 212 and the size of the via 218 is minimized to maximize a fill factor of the storage capacitor and the photosensor. In another embodiment, via 218 is formed under the photo diode or over electrode 212.

In a further embodiment the lower pixel electrode 219 is smaller than the capacitor signal electrode 216 thus ensuring that the storage capacitance is defined by the overlap area of capacitor common electrode 212, capacitor signal electrode 216 and the thickness of the single capacitor dielectric 214.

In addition, the capacitor dielectric 214 is immediately covered by the deposited capacitor signal electrode 216 and thus is protected against damage during subsequent processing operations which could potentially cause shorts. In an example embodiment, the materials used for signal electrode 216 and capacitor common electrode 212 include single or multiple layers of Molybdenum, Chromium, Tantalum, Tungsten, Aluminum, or Titanium. Suitable dielectrics for layer 214 include silicon nitride, silicon oxide and silicon oxi-nitrides.

In the illustrated embodiment, the capacitor signal electrode 216 is larger than the capacitor common electrode 212 of the storage capacitor. By using the larger capacitor signal electrode 216, the storage capacitor is more completely protected during subsequent processes and ensures that the capacitance is defined by the area of capacitor common electrode 212 and the dielectric material 214.

In a further embodiment of pixel 210, (as shown in FIG. 2) capacitor common electrode material 212 is removed under the via region 220. By removing the material from region 220, the potential for capacitor shorts is substantially reduced.

Figure 3:
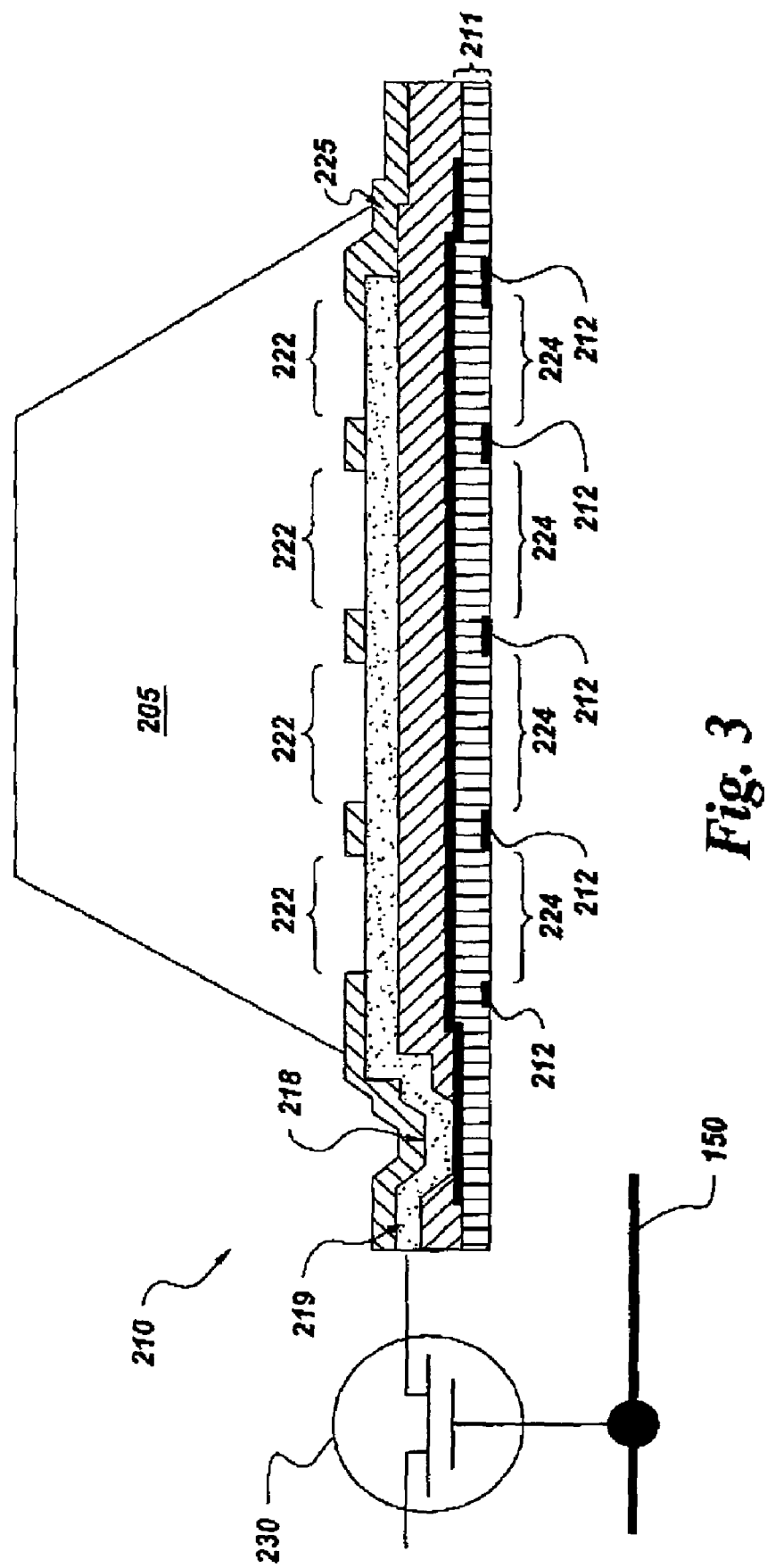
FIG. 3 is a partial cross-sectional view of a pixel implemented in accordance with the present invention illustrating a plurality of vias and a plurality of holes.

In a further embodiment, shown in FIG. 3, pixel 210 further comprises a plurality of vias 222 for coupling the photosensor 205 to capacitor signal electrode 216. Vias 222 are etched through dielectric layer 225 deposited on top of conductive layer 219. The number and spacing of vias is determined based on the time constant of the photosensor. Charge is carried in and out of the photosensor by the doped semiconductor layer (not shown) at the bottom of the photosensor 205. The resistance of this layer is a contributing factor to the RC time constant of the photosensor. Thus, the distance between vias 222 is chosen so as to control the resistance. For medical applications, time constants equal to or less than 10 microseconds are desired and the time constant is determined by the RC product of the regions between vias. In one embodiment, distances between 20 and 40 microns are adequate.

In a further embodiment, a plurality of holes 224 are etched in the capacitor common electrode 212, in regions under the plurality of vias 222. By etching the holes in the capacitor common electrode, capacitor shorts caused by the seeping of etchants through pin holes in the capacitor signal electrode is eliminated. In one embodiment, number of shorted capacitors is reduced from more than 1000 per 20×20 cm panel to fewer than 10 per panel.

In the illustrated embodiment of pixel 210, the storage capacitor is disposed under the photosensor 120. Building the storage capacitor under the photosensor maximizes capacitor area and therefore device capacitance. In a further embodiment, the photosensor is larger than the conductive layer.

The previously described embodiments of the invention have many advantages, maximized capacitor area and maximum photosensor area, minimum diode leakage and reduced capacitor shorts.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An imager, comprising:
   a plurality of pixels disposed on a substrate in an imaging array pattern comprising rows and columns, each of the pixels comprising a respective photosensor coupled to a respective thin film switching transistor;

a plurality of scan lines disposed at a first level with respect to the substrate along a first axis of the imaging array pattern, each row of pixels in the imaging array pattern having a respective scan line, each of the respective scan lines being coupled to a respective gate electrode in the thin film switching transistor for each pixel disposed along the respective row of pixels in the imaging array pattern;

a plurality of data lines disposed at a second level with respect to the substrate along a second axis of the imaging array pattern, each column of pixels in the imaging array pattern having a corresponding data line, each of the respective data lines being coupled to a respective source electrode in the thin film switching transistors for each pixel disposed along the respective column of pixels in the imaging array pattern;

wherein each pixel comprises a storage capacitor coupled parallel to the photosensor, the storage capacitor comprising a capacitor signal electrode and a capacitor common electrode and a dielectric disposed between the capacitor signal electrode and the capacitor common electrode.

2. The imager of claim 1, wherein the capacitor signal electrode comprises at least two conductive layers, and wherein the conductive layers are coupled together by a source metal via.

3. The imager of claim 2, wherein the conductive layers form a lower pixel electrode of the photosensor and the source electrode of the thin film switching transistor.

4. The imager of claim 3, wherein the conductive layers and the capacitor signal electrode are coupled by the source metal via.

5. The imager of claim 3, wherein the photosensor is larger than the conductive layer.

6. The imager of claim 2, further comprising a hole etched in the capacitor common electrode in a region under the source metal via.

7. The imager of claim 1, wherein the gate electrode of the thin film transistor and the capacitor signal electrode comprises a same material.

8. The imager of claim 1, wherein the capacitor common electrode comprises molybdenum, chromium, tantalum, tungsten, aluminum, and titanium.

9. The imager of claim 1, wherein the capacitor signal electrode is larger than the common electrode of the storage capacitor.

10. The imager of claim 1, further comprising a plurality of vias coupling the capacitor signal electrode to the photosensor.

11. The imager of claim 10, wherein the number of vias is determined based on a required time constant of the photosensor.

12. The imager of claim 10, wherein the distance between the vias is determined based on the required time constant of the photosensor.

13. The imager of claim 10, further comprising a plurality of holes etched in the common electrode in a region under the plurality of vias.

14. The imager of claim 1, wherein the storage capacitor is disposed under the photosensor.

15. The imager of claim 1, wherein the imager is an X-ray imager.

* * * * *